United States Patent [19]

Hutsinger

[11] 3,723,890

[45] Mar. 27, 1973

[54] DIGITAL HARMONIC REJECTING PHASE DETECTOR

[75] Inventor: Dean P. Hutsinger, Marion, Iowa

[73] Assignee: Collins Radio Company, Dallas, Tex.

[22] Filed: Oct. 26, 1971

[21] Appl. No.: 192,456

[52] U.S. Cl. ....................329/50, 325/321, 325/346, 328/109, 328/134, 329/104, 329/126

[51] Int. Cl. ..............................................H03d 3/20

[58] Field of Search................329/50, 104, 122, 126; 328/166, 167, 168, 134, 109, 110; 325/487, 346, 321, 325

[56] References Cited

UNITED STATES PATENTS

| | | | |
|---|---|---|---|
| 3,426,291 | 2/1969 | Weglein et al. | 328/165 X |
| 3,548,328 | 12/1970 | Breikss | 329/126 |
| 3,550,018 | 12/1970 | James et al. | 328/165 X |
| 3,624,299 | 11/1971 | Meidan | 328/165 X |
| 3,628,154 | 12/1971 | Weill | 328/167 X |
| 3,649,922 | 3/1972 | Ralph et al. | 328/165 X |

*Primary Examiner*—Alfred L. Brody
*Attorney*—Warren H. Kintzinger et al.

[57] ABSTRACT

A digital harmonic rejecting phase detector inherently capable of rejecting substantially any even harmonic and with provisions for good rejection of at least one odd harmonic present in the input signal. The detector has a bidirectional counter system with a first half unidirectional counter and a second half unidirectional counter with transfer gating periodically transferring content of the first half counter to the second half counter. The bidirectional counter system accomplishes both an invert-noninvert function and the averaging function of a low-pass filter. The input signal is processed through a signal conditioner to a pulse density representation. A reference divider is provided developing the fundamental reference frequency $f_r$ and developing required odd harmonic reference frequencies (i.e., $3f_r$ and $5f_r$) in square wave form. The detector processes the input signal with a VCO for a sine-wave input or a frequency multiplier for an FM input and includes a multiphase clock generator, at least one clock divider (one for each odd harmonic provided for), clock and counter controls, complement gating and two detection counters. Within the detector an increment of resolution is added or subtracted by either or'ing a pulse into the clock stream or by inhibiting a pulse from the clock stream in an operational approach eliminating any requirement for separate harmonic detectors. A small amount of additional gating implements the action of an odd harmonic detector along with gating already present for the fundamental detector.

10 Claims, 8 Drawing Figures

Figure 3:
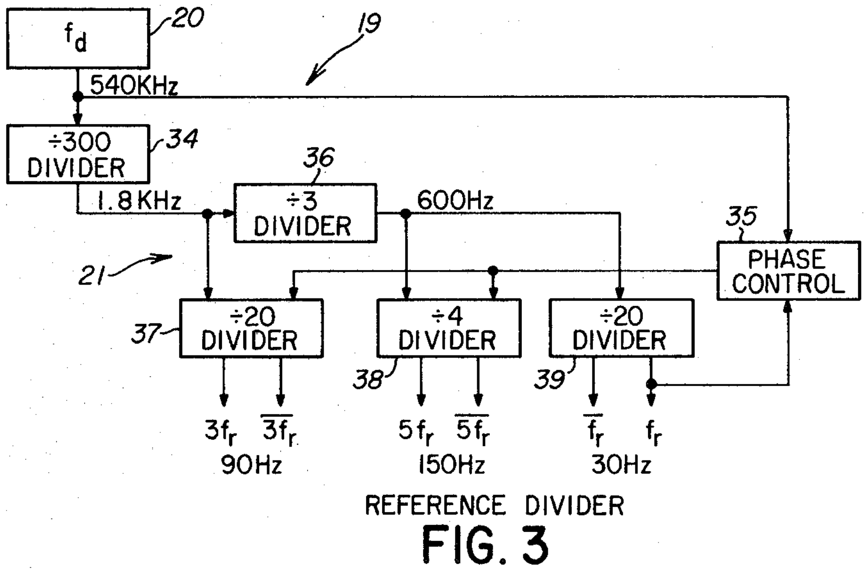

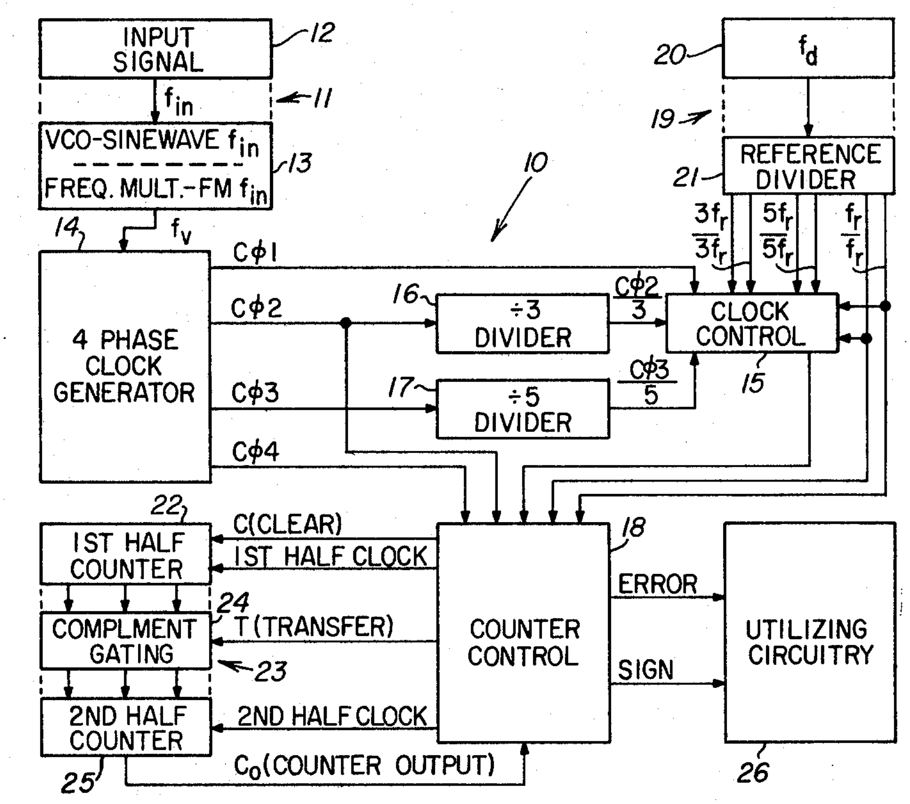
FIG. 1
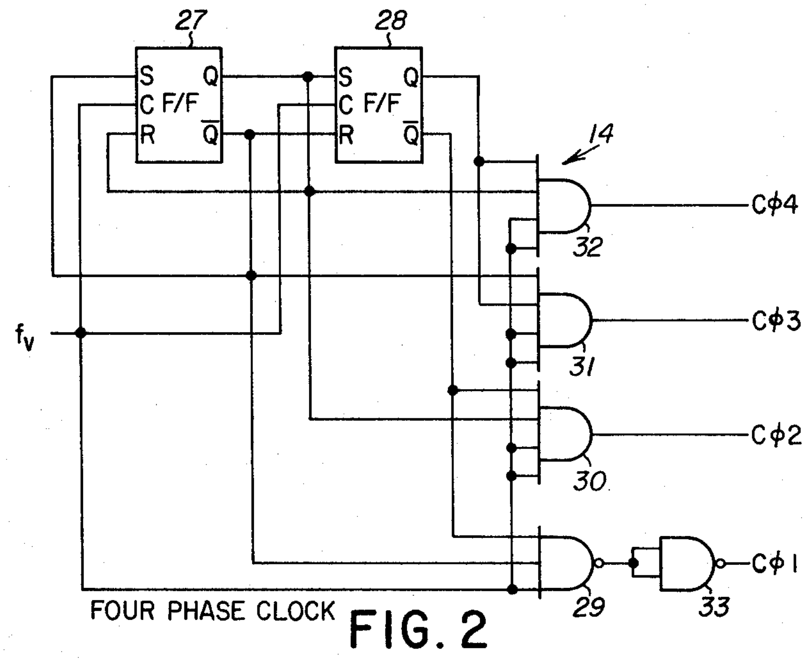
FOUR PHASE CLOCK FIG. 2

REFERENCE DIVIDER

COUNTER CONTROL

FOUR PHASE CLOCK GENERATOR

CLOCK / COUNTER CONTROL

DIGITAL HARMONIC REJECTING PHASE DETECTOR

This invention relates in general to phase detection and, in particular to a digital harmonic rejecting phase detector capable of interfacing with frequency modulated signals as well as normal sine wave signals.

The digital harmonic rejecting phase detector is inherently capable of rejecting substantially any even harmonic and providing good rejection of odd harmonics present in the input signal $f_{in}$, as transformed to $f_v$, much the same as in my co-pending U. S. application, "ANALOG HARMONIC REJECTING PHASE DETECTOR" filed Sept. 27, 1971 Ser. No. 183,924 that may be considered as being the analog counterpart of the digital detector of this case. While the detector rejects substantially all even harmonic distortion, it rejects only those odd harmonic frequencies for which special circuit arrangements are provided. Since, however, there is an attenuation factor of $1/n$ for various harmonics through the detector, circuit provisions are provided for nullifying only a few odd harmonics.

It is, therefore, a principal object of this invention to provide a digital harmonic rejecting phase detector with inherent even harmonic rejection and good rejection of stronger odd harmonic content in the input signal.

Another object is to provide such a digital harmonic rejecting phase detector having specific odd harmonic frequency reference and gating provisions efficiently nullifying odd harmonic content of at least one odd harmonic.

A further object is to provide a digital harmonic rejecting phase detector capable of operation equally well with FM or sine-wave input signals with a frequency multiplier replacing the sine-wave input signal VCO (voltage controlled oscillator) for the FM input signal case, with, however, the remaining portions of detector circuitry unchanged.

Features of the invention useful in accomplishing the above objects include, in a digital harmonic rejecting phase detector, a detector with a bidirectional counter system, with a first half counter and a second half counter accomplishing both an invert-noninvert function and the averaging function of a low-pass filter. The waveform information of the input signal $f_{in}$ is transformed through a frequency modulating signal conditioner to a pulse density representation. The detector consists of a VCO (with sine-wave input) or frequency multiplier (with FM input), a clock generator, two clock dividers, clock and counter controls, complement gating, and two detection counters. The reference divider is such that $f_r$ and required odd harmonic references are generated (i.e. $3f_r$ and $5f_r$). While the analysis employed is for continuous signals and the digital approach is for sampled signals, the high resolutions utilized tend to make resulting approximations sufficiently close to the continuous case for the results to be valid.

A specific embodiment representing what is presently regarded as the best mode of carrying out the invention is illustrated in the accompanying drawings.

Figure 4:
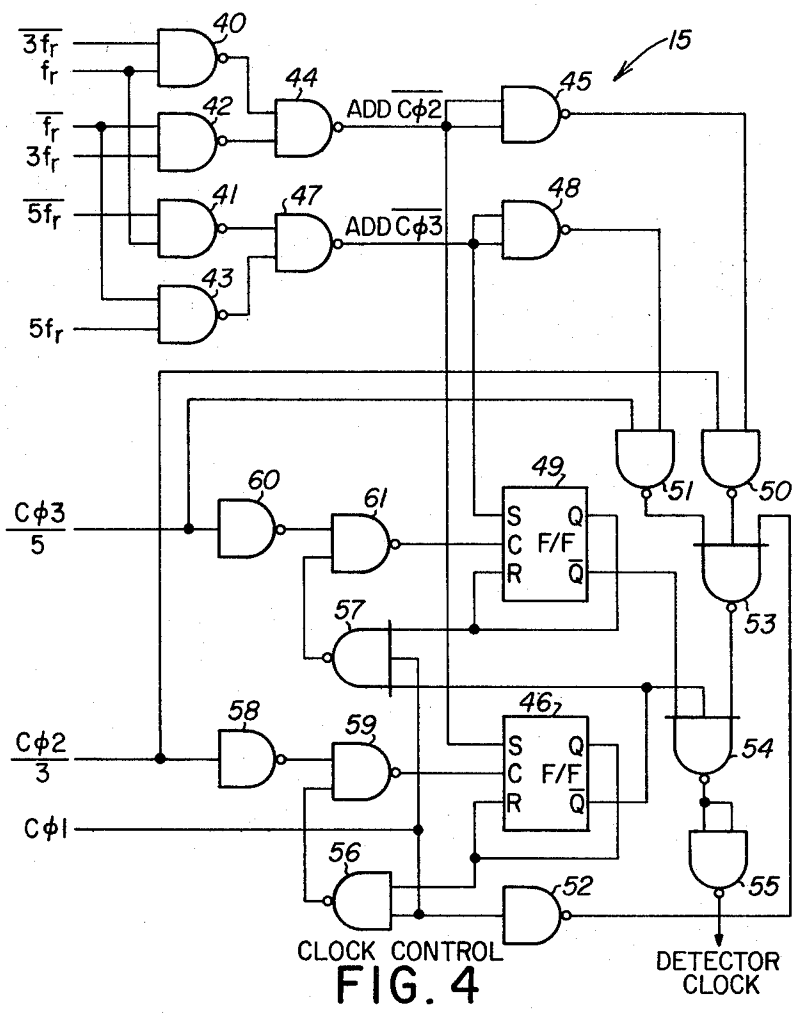
Figure 5:
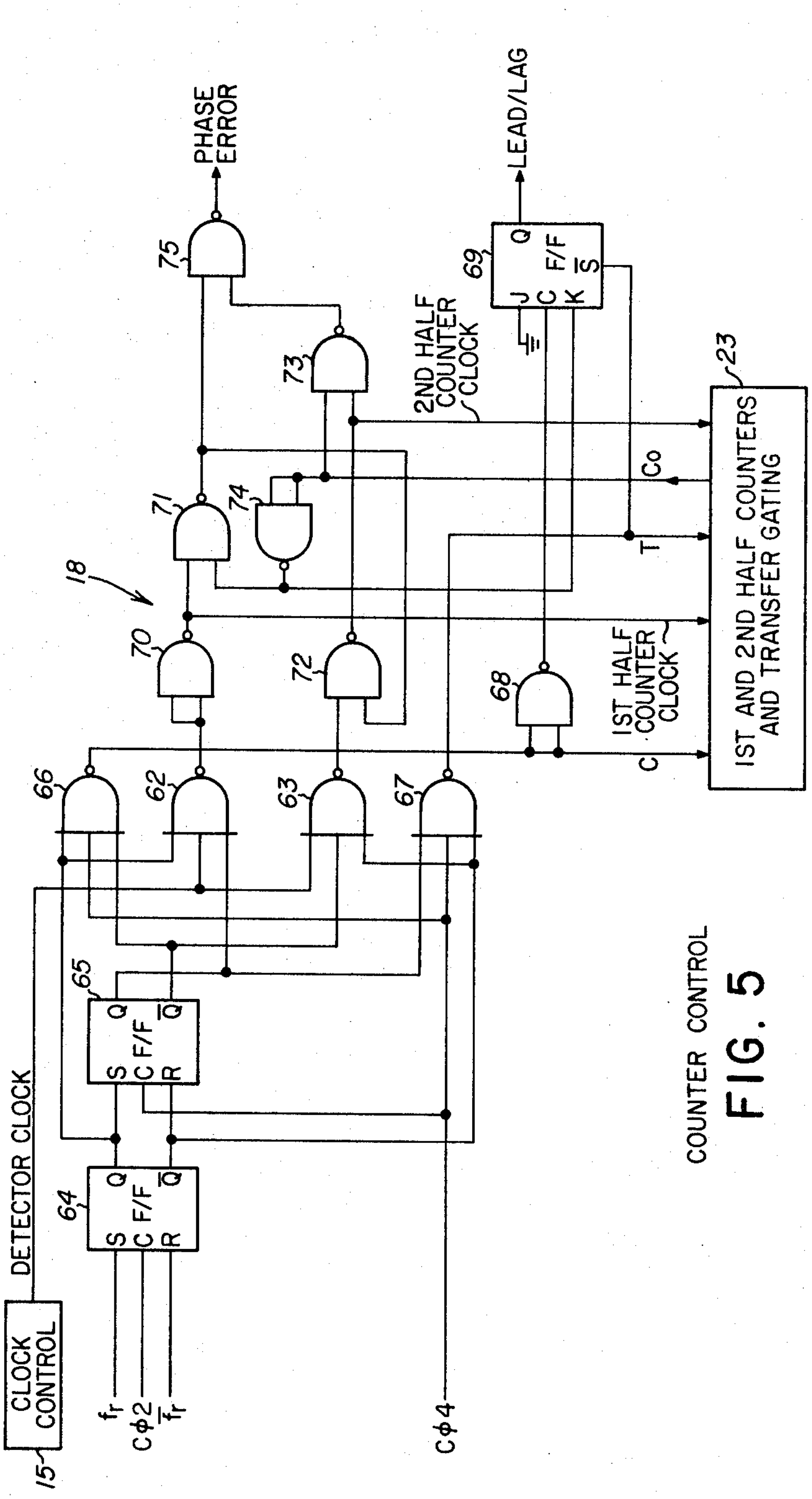
Figure 6:
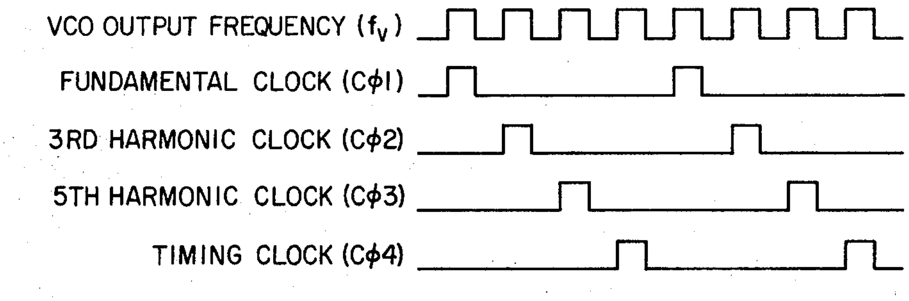
Figure 7:
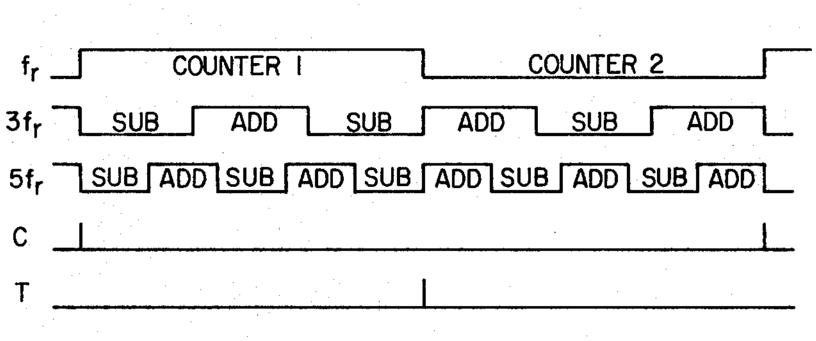
Figure 8:
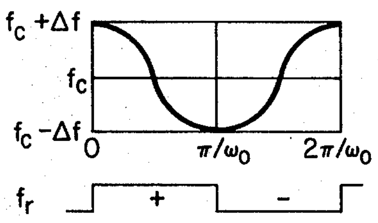

In the drawings:

FIG. 1 represents a block diagram of a digital harmonic rejecting phase detector in accord with applicant's teachings;

FIG. 2, a block-schematic of the four-phase clock generator of FIG. 1;

FIG. 3, a block diagram of the reference divider $f_r$, $3f_r$, and $5f_r$ reference frequency source of FIG. 1;

FIG. 4, a block and logic circuit schematic of the clock control circuit of FIG. 1;

FIG. 5, a block and logic circuit schematic of the counter control circuit of FIG. 1;

FIG. 6, waveforms of VCO (or frequency multiplier) output, fundamental clock (C$\phi$1), third harmonic clock (C$\phi$2), fifth harmonic clock (C$\phi$3), and the timing clock (C$\phi$4);

FIG. 7, $f_r$, $3f_r$, $5f_r$, C (clear), and T (transfer) gating waveforms required by the clock/counter control system of FIG. 1; and FIG. 8, the required deviation $\Delta f_p$ waveform (from $f_c - \Delta f$ to $f_c + \Delta f$ about a center frequency $f_c$ accompanied by the fundamental square wave reference frequency $f_r$.

Referring to the drawings:

The digital harmonic rejecting phase detector 10 of FIG. 1 includes a frequency source 11 supplying a $f_v$ signal subject to harmonic signal rejection processing and phase detection through the detector. The frequency source 11 includes an initial signal source 12 that may be supplying a sine-wave signal $f_{in}$ or an FM input signal $f_{in}$ feeding to circuit 13 that must be a voltage controlled oscillator (VCO) circuit with the sine-wave input, and that must be a frequency multiplier with a frequency modulated (FM) input $f_{in}$ signal. In any event the output signal $f_v$ from circuit 13 is substantially the same regardless of the input $f_{in}$ used with the detector circuit from the $f_v$ signal input terminal on being the same. The $f_v$ signal is fed to four-phase clock generator circuit 14 developing the C$\phi$1, C$\phi$2, C$\phi$3, and C$\phi$4 signals (shown in FIG. 6) applied as inputs to the clock control circuit 15, the divide-by-three divider circuit 16, the divide-by-five divider circuit 17, and the counter control circuit 18, respectively. The divide-by-three divider 16 and divide-by-five divider 17 feed output signal waveforms C$\phi$2/3 and C$\phi$3/5 as additional inputs to clock control circuit 15 that also receives square wave reference frequency inputs $f_r$, $3f_r$, and $5f_r$ from reference frequency source and divider circuit 19. Divider circuit 19 includes a driving frequency $f_d$ source 20 feeding reference frequency divider circuit 21. The reference frequency divider $f_r$ and $\overline{f_r}$ outputs are also applied as square wave input signals to counter control circuit 18 along with the C$\phi$2 and C$\phi$4 signals, and a detector clock signal from the clock control circuit 15.

The C (clear) signal and first half clock signal output connections of the counter control 18 are connected as signal inputs to the first half counter 22 of the counter section 23 of the digital harmonic rejecting phase detector 10. The T (transfer) signal output connection of the counter control circuit 18 is connected as an input to the complement gating circuit 24 of the counter section 23, and a second half clock signal output of the counter control circuit 18 is connected as an input to the second half counter 25 of the counter section 23. The resulting $C_o$ (counter output) from the counter section 23 is connected from the second half counter 25 as an additional input to the counter control circuit 18. Error and sign signal outputs of the counter control circuit 18 are connected as inputs to utilizing circuitry 26.

Referring to the block schematic of FIG. 2 the four-phase clock generator circuit 14 is shown to have the $f_v$ signal input connected to the C terminals of flip-flops 27 and 28 and also as an input to NAND gates 29, 30, 31, and 32. The Q output terminal of flip-flop 27 is connected as an input to the S terminal of flip-flop 28, as an input to NAND gates 30 and 32, and back as an reset terminal input to the flip-flop 27. The $\overline{Q}$ output of flip-flop 27 is connected as a reset input to flip-flop 28, back as an input to the set terminal of the flip-flop 27, and also as an input to NAND gates 29 and 31. The Q output of NAND gate 28 is connected as an input to NAND gates 31 and 32 and the $\overline{Q}$ output of flip-flop 28 is connected as an input to NAND gates 29 and 30. The output of NAND gate 29 is connected as an input to two terminals of NAND gate 33 in order to provide the C$\phi$1 output from the NAND gate 29 and NAND gates 30, 31, and 32 provide respectively the C$\phi$2, C$\phi$3, and C$\phi$4 outputs resulting from the $f_v$ input to the four-phase clock circuit 14.

Referring to the reference frequency source and divider circuit 19 of FIG. 3 the signal output of the driving frequency $f_d$ source 20 is in this particular instance as a 540 KHz square wave signal applied as an input to divide-by-300 divider 34. The 540 KHz $f_d$ signal is also applied as an input to phase control circuit 35 that in this particular embodiment is a logic one-shot multivibrator circuit. The 1.8 KHz output of divide-by-300 divider 34 is applied as an input to divide-by-3 divider 36 and also as an input to the divide-by-20 divider 37 that has a $3f_r$ 90 Hz square wave output signal. The 600 Hz output of the divide-by-3 divider 36 is connected as an input to divide-by-4 divider 38 that develops a $5f_r$ 150 Hz square wave output signal. The 600 Hz output signal of the divide-by-3 divider 36 is also connected as an input to divide-by-20 divider 39 developing a 30 Hz $f_r$ output signal that in addition to being an output is connected back as a phase control input to phase control circuit 35 for a phase control output to be developed from the phase control circuit 35 as a phase controlling input to the divide-by-20 divider 37 and the divide-by-4 divider 38. This enables the resulting $f_r$, $3f_r$, and $5f_r$ signals to be in controlled phase relation as shown in FIG. 7 as well as their inversions $\overline{f_r}$, $\overline{3f_r}$, and $\overline{5f_r}$ also provided from the divider circuits 39, 37, and 38, respectively.

Referring also to the clock control circuit 15 of FIG. 4 the $f_r$ signal from reference divider circuit 19 is applied as an input to NAND gates 40 and 41 while the $\overline{f_r}$ inversions thereof is applied as an input to NAND gates 42 and 43. The $3f_r$ signal is applied as an input to NAND gate 42 while its $\overline{3f_r}$ inversion is applied as an input to NAND gate 40. The $5f_r$ signal is applied as an input to NAND gate 43 and the $\overline{5f_r}$ inversion thereof is applied as an input to NAND gate 41. The outputs of NAND gates 40 and 42 are applied as the two inputs to NAND gate 44 developing an add $\overline{C\phi 2}$ signal applied as a gating control input to NAND gate 45 and also to the set terminal of flip-flop 46. The outputs of NAND gates 41 and 43 are connected as the inputs to NAND gate 47 developing an add $\overline{C\phi 3}$ signal applied as an input to NAND gate 48 and also as an input to the set terminal of flip-flop 49. The output of NAND gate 45 is connected as an input to NAND gate 50 that is also connected to receive the C$\phi$2/3 signal as an input. The NAND gate 48 output is connected as an input to NAND gate 51 that is also connected to receive the C$\phi$3/5 signal as an input. The C$\phi$1 signal is applied through inverter NAND gate 52 along with the outputs of NAND gates 50 and 51 to three-input NAND gate 53 having an output applied as an input to three-input NAND gate 54. The output of NAND gate 54 is applied to two inputs of NAND gate 55 with the detector clock signal output. The C$\phi$1 signal is also applied as an input to NAND gate 56 and also to three-input NAND gate 57. The C$\phi$2/3 signal is applied as an input to NAND gate 58 the output of which along with the output of NAND gate 56 are applied as two inputs to NAND gate 59. The output of NAND gate 59 is applied as the C terminal input to flip-flop 46 having a Q output connected back to the reset terminal of the flip-flop 46 and also as a second input to the NAND gate 56. The $\overline{Q}$ output of NAND gate 46 is connected as an input to both NAND gate 54 and NAND gate 57. The C$\phi$3/5 signal is connected through inverter NAND gate 60 to NAND gate 61 also receiving an input from the output of NAND gate 57. The output of NAND gate 61 is connected to the C terminal of flip-flop 49 having a Q output connected back to the reset terminal of the flip-flop 49 and also as a third input to NAND gate 57. The $\overline{Q}$ output of flip-flop 49 is connected as a third input to NAND gate 54.

Referring also to the counter control circuit 18 of FIG. 5 the detector clock signal from clock control circuit 15 is connected as an input to NAND gates 62 and 63. The $f_r$ signal and the $\overline{f_r}$ inversion thereof are applied, respectively, as inputs to the set and reset terminals of flip-flop 64, and the C$\phi$2 signal is applied to the C terminal of the flip-flop 64. The Q signal output of flip-flop 64 is applied to the set terminal of flip-flop 65, and also as an input to NAND gates 62 and 66 while the $\overline{Q}$ output is applied as a reset input to flip-flop 65 and as an input to NAND gates 63 and 67. The C$\phi$4 signal is applied as an input to the C terminal of flip-flop 65 and to NAND gates 66 and 67. The Q output of flip-flop 65 is applied as an input to NAND gates 62 and 67 while the $\overline{Q}$ output thereof is applied as an input to NAND gates 63 and 66. The clear C pulse waveform output of NAND gate 66, such as shown in FIG. 7, is applied to the first half counter in the counter circuit section 23 and also to two input terminals of NAND gate 68 having an output connection to the C terminal of JK flip-flop 69. The output of NAND gate 62 is applied to two input terminals of NAND gate 70 with the output thereof being the first half counter clock applied as an input to the first half counter of the counter circuit section 23. This signal is also applied as an input to NAND gate 71. The output of NAND gate 63 is applied as an input to NAND gate 72 that also has an input connection from the output of NAND gate 71 in developing a second half counter clock output that is connected as the second half clock input to the second half counter of the counter circuit section 23 and that is applied as an input to NAND gate 73. The transfer signal pulse output waveform such as shown in FIG. 7 developed as an output from NAND gate 67 is applied to the complement transfer gating in the counter circuit section 23 and also as an S input to the JK flip-flop 69.

The $C_o$ counter output from the counter circuit section 23 is applied as an input to NAND gate 73 and also as an input to two input terminals of NAND gate 74. The output of NAND gate 74 is applied as a second input to NAND gate 71 and the K input terminal of JK flip-flop 69. The outputs of NAND gates 71 and 73 are applied as the two inputs to NAND gate 75 developing the desired phase error signal output. The desired lead/lag output signal is developed as an output from the Q terminal of the JK flip-flop 69.

The bidirectional counter system employed in the digital harmonic rejecting phase detector accomplishes both an invert/noninvert amplifier function and the averaging function of a low-pass filter. In order to obtain waveform information of the input signal $f_{in}$ frequency modulating signal conditioning means transforms the input signal $f_{in}$ waveform to a pulse density $f_v$ signal representation. While the phase detector employs a digital sampled signal approach the high resolutions utilized tend to make the resulting approximations sufficiently close to the continuous case to allow analysis mathematics such as used for continuous signals to be valid. The phase detector employs a system of pulse density addition and subtraction essential to the operation of the phase detector. In order that this may be understood assume that one has a counter of modulus R, and periodically feeds the counter a modulo R of pulses. Further assume that the counter is initially at a zero state. If one feeds R pulses to the counter, the counter will again be at a zero state. However, if one wishes to add or subtract one count from the counter number, he could feed $R + 1$ or $R - 1$ pulses to the counter. Thus, the resulting number where the counter would stop would be one count different than the number it held before the pulse modulo.

In this manner, addition or subtraction may be accomplished in a process with continuous type operation. In this case, an increment of resolution may be added or subtracted by either or'ing a pulse into the clock stream or by inhibiting a pulse from the clock stream. The phase detector utilizes this feature in order to eliminate any requirement for separate harmonic detectors. The circuitry mechanism allows only a small amount of additional gating to implement the action of an odd harmonic detector along with the gating already present for the fundamental detector. In any event the harmonic rejecting phase detector operates equally well with FM or sine-wave input signals as long as a frequency multiplier replaces the VCO, used with a sine wave $f_{in}$, for the FM case, with the remaining portions of the phase detector being unchanged.

The digital harmonic rejecting phase detector of FIG. 1 with a sine wave $f_{in}$ input signal consists of a VCO, a clock generator 14, two clock dividers 16 and 17, clock and counter control circuits 15 and 18, complement gating 24, and two detection counters first half counter 22 and second half counter 25. The reference divider 21 is such that $f_r$ and the required odd harmonic references $3f_r$ and $5f_r$ are generated. Detection is accomplished as generally described previously; with however, the way the various function blocks accomplish detection being in accord with the following description.

With reference divider circuit 19 such as detailed in FIG. 3 and a required $f_r$ frequency of 30 Hz and a desired resolution of 0.02° a driving frequency $f_d$ frequency of 540 KHz is required. Further, with a resolution of 0.02° then $N$ = 360°/Resolution = 360°/0.02 = 18,000. The divider was arranged with a common 300 divider for all frequencies generated, having an output of 1.8 KHz. The $3f_r$ signal of 90 Hz is generated by a 20 divider, driven by the 1.8 KHz signal. The $f_r$ and $5f_r$ signals share a common 3 divider having a 600 Hz output signal. A 4 divider generates the $5f_r$ signal of 150 Hz and a 20 divider generates the 30 Hz $f_r$. Proper phasing of the dividers not in the $f_r$ divider string, is accomplished by a phase control circuit forcing the phase relationship with respect to $f_r$ that is chosen to accomplish harmonic subtraction as described earlier.

The four-phase clock generator of FIG. 2 accomplishes the required pulse density additions and provides a clock phase for each harmonic detector. Fundamental operation is accomplished by a bidirectional counter action with counter direction controlled by $f_r$; however, since the detector is of the continuous type and direction control is effected only by $f_r$, two counters required are configured in a manner requiring only unidirectional counters. Waveform $f_r$ will select the first half counter 22 for the up direction and then select the second half counter for the down direction. The 1's complement gating is used for a parallel transfer between counters and the combination is in effect a bidirectional counter. An advantage of operating in this manner is that the resultant phase differential number is in the second half counter at the end of determination. Coincident operation may be achieved when the first half counter is used for determination, by using the second half counter to read out the phase error. Since the maximum error is only ±180°, the readout will be complete before the second half counter is required for determination. The 2's complement transfer is the proper transfer between the counters; however, the 1's complement transfer is used for the reasons described earlier and includes the errors presented. When the instantaneous frequency waveform $f_v$ presented by the VCO is positive the frequency will be higher than the center frequency and lower than the center frequency when it is negative. The resulting FM signal is accumulated by the first half counter during the invert portion of $f_r$ and then accumulated by the second half counter during the noninvert portion of $f_r$. Since each counter represents a direction, the averaging process of a low-pass filter is accomplished. When $f_{in}$ and $f_r$ are in phase quadrature, each counter will accumulate counts at the higher and lower frequencies for equivalent periods of time. The accumulations are effectively subtracted and result in a number zero accumulation stored in the second half counter representing a phase differential of 0°. A number representative of phase differential will result in the second half counter based on the relative time the input frequency is accumulated at the higher and lower frequencies. Sign information is extracted from the phase differential number determined and readout is then accomplished by use of the number stored in the second half counter.

Odd harmonic detection is basically through operation in the same manner with weighting of the clock frequencies for gain equalization accomplished by the 3 and 5 dividers 16 and 17 acting in effect as attenuators. The output of these dividers either adds or subtracts pulses from the fundamental frequency stream by way of the clock control circuit 15. The control combines $3f_r$ and $f_r$ to control this pulse density operation for the 3rd harmonic detection and likewise the $5f_r$ and $f_r$ signals for the 5th harmonic detection. The resulting clock stream is fed to the first half and second half counter circuit 23. The counter direction control is not altered because the fundamental and harmonic combinations result in a direction which is dictated by $f_r$. The modulo control for the second half counter readout is the first half of the $f_r$ waveform. This gates the VCO output generated pulses via the four-phase clock circuit 14 to the second half counter 25 and the output is accomplished by gating these clocks from the beginning of the modulo control until the second half counter overflows, or from overflow until the end, depending upon the sign of detection. As can be seen, this digital approach effectively generates the operational action of odd harmonic detectors by additional gating and does not require a complete detector for each odd harmonic.

The $f_v$, C$\phi$1, C$\phi$2, C$\phi$3, and C$\phi$4 waveforms of FIG. 6 show the timing generated by the clock generator circuit 14 and FIG. 7 illustrates the gating $f_r$, $3f_r$, and $5f_r$ square wave waveforms required by the clock control, and the C (clear) and T (transfer) pulse waveforms developed out of counter control circuit 18.

While with some previous detectors, the detector parameters were dependent upon $f_d$, and the desired resolution was dependent upon the reference divider employed the digital harmonic rejecting phase detector parameters are governed by the VCO employed and with reference to FIG. 8 the parameter derivation is in accord with the following. The required peak frequency deviation, $\Delta f_p = (f_c + \Delta f) - (f_c - \Delta f)$, determines the detector resolution and gain.

$$f_v = f_c + \Delta f_p \cos(\omega_o t + \phi)$$

$$\text{No.} \leqq \left| \Delta f_p \int_0^{\pi/\omega_0} \cos(\omega_0 t + \phi) dt - \Delta fp \int_{\pi/\omega_0}^{2\pi/\omega_0} \cos(\omega_0 t + \phi) dt \right| \leqq \left| \frac{-4\Delta f_p}{\omega_0} \sin(\phi) \right| \quad 1$$

$$L \geqq \frac{1}{2}\frac{f_c}{f_0} + \Delta f_p \int_0^{\pi/\omega_0} \sin(\omega_0 t) dt \geqq \frac{1}{2}\frac{f_c}{f_0} + \frac{2\Delta f_p}{\omega_0} \quad 2$$

$H = \text{No.}/\theta$ for $\theta$ = small angles
$H = \Delta f_p/\omega_o\ (.07)$ for $\theta = .1°$
No. = number of pulses
$f_c$ = VCO center frequency
$\Delta f$ = VCO deviation
$\Delta f_p$ = VCO peak deviation
$f_v$ = VCO output frequency
$f_o$ = modulating frequency ($f_{in}$)
$H$ = gain
$\theta$ = phase angle Equation 1 expresses the relationship between $\Delta f_p$ and the resolution required. Equation 2 is used to determine the minimum counter length for the first half counter and the second half counter and equation 3 is used to determine the detector gain, H. The readout frequency, $f_x$, is always $f_v$ for this detector.

The detector parameter values with a detector adapted for interface with either a sine-wave or FM signal are as follows:

| Parameters | Criteria |
|---|---|
| Sine-wave signal | |
| $f_{in}$ = 30 Hz | Given |
| FM signal | |
| $f_o$ = 30 Hz | Given |
| $f_c$ = 9960 Hz | Given |
| $\Delta f = \pm 480$ Hz | Given |
| Common to both | |
| Resolution = 0.1° | Given |
| $\Delta f_p$ = 122.88 KHz | Equation 1 |
| $f_c$ = 2,549,760 Hz | Chosen |
| L = 14 bits | Equation 2 |
| H = 11.4 pulses/sec/deg | Equation 3 |
| Frequency multiplication = 256 | Chosen |

The FM signal employed had a center frequency of 9960 Hz with a peak deviation of 480 Hz. The modulating frequency was 30 Hz as was the input frequency for the sine-wave input signal. The required resolution was 0.1° and that obtained was approximately 0.088°. Use of equation 1 resulted in a $\Delta f_p \geq 25.6$ KHz; however, 64 times 480 Hz deviation of the FM signal results in a $\Delta f_p$ = 30.720 KHz. To account for the four-phase clock operation this was increased to 122.88 KHz. The VCO center frequency was chosen as 4 × 64 × 9960 Hz, resulting in an $f_c$ = 2,549,760 Hz. A linear frequency multiplier factor of 256 was applicable as was a VCO that was compatible with the given parameters.

The counter control is sequentially, the first half counter is cleared, as shown in FIG. 1, by control signal C. The frequency output of the clock control circuit 15 is then fed to the first half counter 22 during the appropriate portion of $f_r$. Control signal T then transfers the 1's complement of the first half counter contents to the second half counter 25. The second half counter 25 is always fed the frequency output of the clock control circuit 15; however, it actually counts from the number, transferred by T, until the next signal C pulse occurs. The resulting number is then gated to the output, as a pulse train, during the first half counter operation. The second half counter is one bit larger than the first half counter in order to determine sign information. The state of the highest order bit can then be sampled and stored in the sign memory by signal C. This sign information can also be utilized to supervise readout operation. It simply steers the clocks required to overflow the second half counter or the number of clocks that elapse from second half counter overflow until T, whichever is appropriate.

It is of interest to note that very narrow bandwidth operation can be obtained by digital phase lock loop design. Bandwidths as narrow as 0.01 Hz are easily obtained. However, a phase lock loop exhibits a comb filter response, where the bandwidth is centered around each harmonic of the loop frequency. Employing the harmonic rejecting detector within the loop eliminates this problem. The combination of detector and loop results in an excellent digital filter for very narrow bandwidth applications.

Whereas this invention is here illustrated and described with respect to a specific embodiment hereof, it should be realized that various changes may be made without departing from the essential contributions to the art made by the teachings hereof.

I claim:

1. A digital harmonic rejecting phase detector comprising:

a pulse density modulated signal source producing a signal having a center frequency, a reference frequency source developing a square wave reference frequency $f_r$ and at least the first odd harmonic reference frequency $3f_r$, said center frequency being a multiple of said reference frequency, signal pulse splitting means dividing said signal from said pulse density modulated signal source into at least a first phase section, a second phase section, and a final phase section, clock control gating means, means connecting said reference frequency $f_r$ and said odd harmonic reference frequency to said clock control gating means, means connecting said first phase section to said clock control gating means, means including a 3 divider circuit connecting said second phase section to said clock control gating means, counter means including a bidirectional counter section capable of counting an up count modulo and a down count modulo for up/down count control, and counter control circuit means interconnected with said reference frequency source, said clock control gating means, and said signal pulse splitting means for generating a clock pulse stream for application to said bidirectional counter section and including means for gate or'ing pulses into said clock pulse stream, means for gate inhibiting pulses from said clock pulse stream, and means for receiving an output from said counter means and establishing phase error and sign thereof.

2. The digital harmonic rejecting phase detector of claim 1, wherein said bidirectional counter section includes, first half counter means and a second half counter means; complement signal transfer gating means interconnecting said first and second half counter means; said reference signal $f_r$ being a square wave symmetrical signal with a first up count half cycle and a second down count half cycle connected for controlled up count by said first half counter during the up count half cycle of the $f_r$ signal; substantially instantaneous complement gate means transfer of first half counter count to said second half counter means at the initiation of the second down count half cycle of the $f_r$ signal; down count by said second half down counter during the down count half cycle of the $f_r$ signal; and counter output circuit means gate activated by the start of the next successive first up count half cycle.

3. The digital harmonic rejecting phase detector of claim 2, wherein fifth harmonic rejecting means are included with the reference frequency source also developing a second odd harmonic reference frequency $5f_r$ square wave signal; said signal pulse splitting means also includes a third signal phase section output passed as an input to a 5 divider circuit output connected to said clock control gating means.

4. The digital harmonic rejecting phase detector of claim 2, wherein said pulse density modulated signal source includes a voltage controlled oscillator developing a relatively high frequency pulse output connectable for receiving a relatively low frequency sine wave modulating input signal.

5. The digital harmonic rejecting phase detector of claim 4, wherein the reference frequency signal $f_r$ is at substantially the same frequency as the relatively low frequency sine wave modulating input signal.

6. The digital harmonic rejecting phase detector of claim 2, wherein said pulse density modulated signal source includes a frequency multiplier circuit connectable for receiving a frequency modulated input signal.

7. The digital harmonic rejecting phase detector of claim 2, wherein sign information is extracted from the phase differential number determined and readout is made only from said second half counter.

8. The digital harmonic rejecting phase detector of claim 7, wherein the second half counter is one bit larger than the first half counter for determination readout of the sign information.

9. The digital harmonic rejecting phase detector of claim 8, wherein the sign information gate steers a clock pulse train to overflow the second half counter, or the number of clock pulses that elapse from second half counter overflow until next transfer from the first half counter is gate initiated.

10. The digital harmonic rejecting phase detector of claim 7, wherein counter control is sequentially: the first half counter is cleared by a first control signal with a detector clock signal from the clock control gating circuit means then being fed to the first half counter through the first half cycle of $f_r$; a control transfer signal activates complement transfer gating circuit means for transfer of the 1's complements of the first half counter content to the second half counter; the second half counter then actually counts from the number transferred by said complement gating means until the next said first control signal with the resulting number then gated to an output as a pulse train during the next successive first half cycle of the reference signal $f_r$.

* * * * *